United States Patent [19]

Crowther et al.

[11] 4,231,031

[45] Oct. 28, 1980

[54] REMOTE CONTROL SYSTEM CAPABLE OF TRANSMITTING THE INFORMATION WITH THE AID OF AN INFRA RED BEAM USING PPM OR AN ULTRASONIC BEAM USING PDM

[75] Inventors: Gerald O. Crowther, Sutton; Terence A. Douglas, Banstead; Howard M. Farmer, Selsdon, all of England

[73] Assignee: U.S. Philips Corporation, New York, N.Y.

[21] Appl. No.: 894,245

[22] Filed: Apr. 7, 1978

Related U.S. Application Data

[63] Continuation of Ser. No. 875,338, Feb. 6, 1978.

[30] Foreign Application Priority Data

Feb. 9, 1977 [GB] United Kingdom ............... 5300/77

[51] Int. Cl.² ...................... H04B 7/00; H04B 11/00; H03K 13/24
[52] U.S. Cl. ........................... 340/695; 340/167 A; 358/194.1; 375/23; 455/151; 455/353; 455/603; 455/608
[58] Field of Search ............... 325/390–394, 325/55, 58, 37, 141–143, 321; 250/199; 358/194; 343/225–228; 340/365 R, 365 S, 167 A; 307/261, 268, 291; 328/119, 164

[56] References Cited

U.S. PATENT DOCUMENTS

| | | | |
|---|---|---|---|
| 2,266,401 | 12/1941 | Reeves | 325/143 |
| 3,631,398 | 12/1971 | Houghton | 358/194 |
| 3,831,092 | 8/1974 | Greefkes | 325/142 |
| 3,906,348 | 9/1975 | Willmott | 325/37 |
| 3,987,414 | 10/1976 | Tuma | 358/194 |
| 4,001,693 | 1/1977 | Stackhouse et al. | 325/58 |
| 4,027,243 | 5/1977 | Stackhouse et al. | 325/58 |

OTHER PUBLICATIONS

Podolsky, "TV and Radio Remote Control", Mundo Electronico (Spain); Apr. 1975, pp. 39–46.
"Infrared Remote Control for Colour TV Receivers," Funkschau (West Germany); vol. 48, No. 24, Nov. 1976; p. 1058.
Carlson, "Communication Systems" McGraw-Hill Book Co., 1968, p. 296.

*Primary Examiner*—Marc E. Bookbinder
*Attorney, Agent, or Firm*—Thomas A. Briody; William J. Streeter; Edward W. Goodman

[57] ABSTRACT

A remote control system for TV receiver control. The system uses infra-red transmission to trasmit an infra-red data pulse on each edge of a pulse duration signal comprising a coded pattern of binary 0 and 1 bits which are formed by pulses of respective different lengths. The original pulse duration signal can be reconstituted at a receiver by a bistable element which is responsive to the infra-red data pulses. Since the regenerated modulating waveform could be in anti-phase with the original modulating waveform, the sequence of data pulses is transmitted twice and an additional data pulse is transmitted between successive transmissions, so that one or the other of the two regenerated modulating waveforms must be in phase with the original modulating waveform.

9 Claims, 11 Drawing Figures

REMOTE CONTROL SYSTEM CAPABLE OF TRANSMITTING THE INFORMATION WITH THE AID OF AN INFRA RED BEAM USING PPM OR AN ULTRASONIC BEAM USING PDM

CROSS REFERENCE TO A RELATED APPLICATION

This application is a continuation of U.S. application Ser. No. 875,338, filed Feb. 6, 1978, the priority of which is hereby claimed.

BACKGROUND OF THE INVENTION

The invention relates to a remote control system in which each of a plurality of remote control functions is represented by a message sequence comprising a plurality of binary bits of which a binary bit 0 and a binary bit 1 are distinguishable from each other by having, for the whole duration of a first period, different time ratios of two different parameters, being respectively a high level and a low level portion of a bit period, forming a pulse duration signal having an edge each time said signal is changing from one level to the other.

In most remote control system used nowadays for controlling a television receiver, an ultrasonic beam is used as the carrier for transmitting information from the transmitter to the receiver.

However such ultrasonic transmission is sensitive to disturbance because ultrasonic sound can easily be produced by moving certain objects present in the room where said remote control system is operating.

Therefore, newer systems use, instead of an ultrasonic beam, an infra red beam as the carrier for transmitting the information from transmitter to receiver.

However certain TV setmakers are still using the older ultrasonic method while others use the infra red beam.

Thus, the manufacturer, of the encoder for the transmitter and the decoder for the receiver, which decoder and encoder are nowadays manufactured as integrated circuits made on a semi-conductor body, has to take care that they can be used for both systems.

It should also be taken into account that the light emitting diodes (LED), used as the light source at the transmitter end, require a relatively large current in order to emit sufficient infra red light to reach the receiving channel in the TV receiver, which can be situated at several meters distance from the transmitter.

SUMMARY OF THE INVENTION

So it is an object of the invention that the pulse duration signal, which is normally used for the ultrasonic transmission, and the several binary bits of which can last for several milliseconds, is converted in very short dot pulses so that the large current flowing through the light emitting diode only flows for a very short time. Thus the energy to be delivered by the battery in the transmitter, in case of infra red transmission, is greatly reduced.

In order to achieve this result, the remote control system in accordance with the present invention is characterized in that, in order to be able to use the same encoder at the transmitter side and the same decoder at the receiver side both for ultrasonic and for infra red transmission of said binary bits, the encoder comprises means for converting, in case of infra red transmission, said pulse duration signal into a pulse position modulation signal whereby a data pulse (R', S' resp. R', T') is transmitted on each edge of said pulse duration signal and whereby the decoder comprises means for reconstituting, in case of infra red transmission, the received pulse position modulation signal into the original pulse duration signal.

In the present context, a complement word is one in which each discrete binary bit is the complement of the corresponding binary bit in the original word. Also, in the present context, m, the number of bits in a short start word, is at least three and the value of n, the number of bits in a message word, depends on the number of control functions to be performed. Furthermore, the term "binary coded word" is used herein to denote an ordered number of binary bits, even though such binary bits could be separated into groups which effectively form what might be termed "sub-words".

A transmitter for use in such a remote control system can be characterized in that said means in the encoder for converting the pulse duration signal into a pulse position modulation signal are a first AND-Gate (G11), to a first input terminal of which the pulse duration signal is applied, a second AND-Gate (G15), to a first input terminal of which a switching signal is applied, an input terminal (IR/US), to which is applied an information signal determining whether infra red or ultrasonic transmission occur, said input terminal (IR/US) being connected to a second input terminal of said second AND-Gate (G15) and, through an inverter (IV2), to a second input terminal of said first AND-Gate (G11), and wherein the two outputs of the two AND-Gate (G11, G15) are connected to two input terminals of an OR-Gate (G12), the output terminal of which is connected to the transmitting device.

A receiver for use in such a remote control system can be characterized in that said means in the decoder for reconstituting the received pulse duration modulation signal into the original pulse duration signal are a first AND-Gate (G16), to a first input terminal of which the received signal is applied, a divide-by-two circuit (DR5) to an input terminal of which said received signal is also applied, a second AND-Gate (G17), a first input terminal of which is connected to an output terminal of said divide-by-two circuit (DR5), an input terminal (IR/US'), to which is applied an information signal indicating whether infra red or ultrasonic transmission takes place, said input terminal (IR/US') being connected to a second input terminal of said second AND-Gate (G17) and, through an inverter (IV3), to a second input terminal of said first AND-Gate (G16), and wherein the output terminals of said two AND-Gates (G16, G17) are connected to two input terminals of an OR-Gate (G18), from the output terminal of which the pulse duration signal is obtained.

DESCRIPTION OF THE DRAWINGS

An embodiment of the invention will now be described, by way of example, with reference to the accompanying drawings, of which:

FIG. 5b shows another embodiment of a part of the receiver decoder of FIG. 5;

DESCRIPTION OF THE PREFERRED EMBODIMENT

Figure 1:
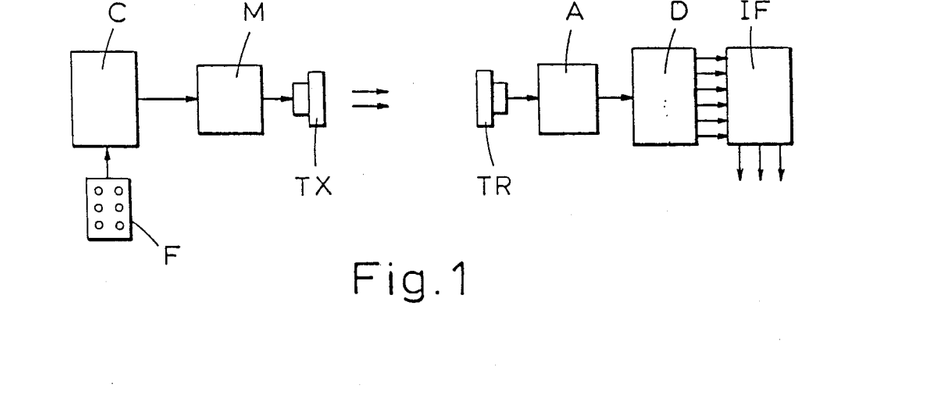
FIG. 1 shows a basic block diagram of a remote control system.

Referring now to FIG. 1, there is shown in block diagrammatic form a basic remote control system. The transmitter consists of a function selection unit F, a coder C, a modulator and amplifier circuit M, and an output energy transmitter element or transmitting device TX. The receiver consists of an input energy receiver element or receiving device TR, an amplifier and detector circuit A, a decoder D and an interface circuit IF. The outputs of the decoder D are converted by the interface circuit IF into signals which are used to control the required functions. In a television set, for example, these functions may include on/off, TV channel selection, colour, brilliance and volume control.

When used in connection with a television set, the transmitter may be in the form of a small box which can be held in a person's hand. The transmitter element TX would be mounted at one end of the box, and on the box would be mounted a set of push buttons or other suitable control contacts. To change the volume and/or any of the other controls on the television set, the transmitter element TX would be pointed towards the television set and the appropriate button on the transmitter depressed. For a simple channel change the button would be depressed for a short time only, but for a volume or brilliance change the appropriate button would be depressed until the desired level of volume or brilliance had been attained. In the performance of the invention, the transmitter element TX is suitably an infra-red transmitter, and in the embodiment to be described the system has such an infra-red transmitter. However it will be clear that also an ultrasonic transmitter, which is a selectable alternative to the infra-red transmitter, can be used. The receiving device TR, in case an infra-red beam is used, is a light sensitive element. When ultrasonic information is transmitted, device TR is a microphone.

Figure 2:
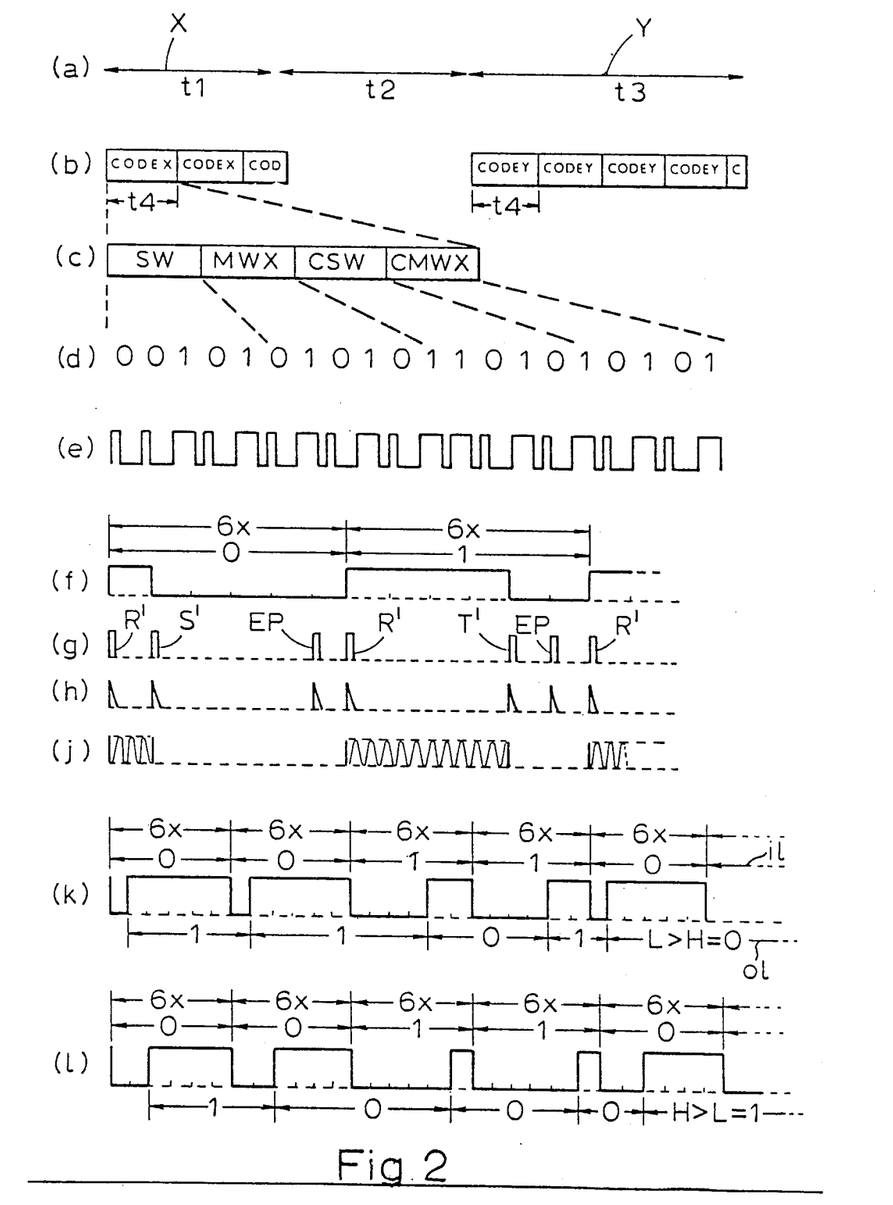
FIG. 2 shows a transmission code for use in the system of FIG. 1 and the production of data pulses according to that code and in accordance with the invention.

Referring now to FIG. 2, FIG. 2(a) shows a selection of a remote control function X for a time t1 followed, after an interval of time t2, by the selection of a different remote control function Y for a time t3. FIG. 2(b) shows that in the time t1 a code, CODE X, which takes a time t4 to be transmitted, is initially transmitted, then immediately repeated in complete form, and then repeated again but not in complete form. In the time t3 a different code, CODE Y, which also takes the time t4 to be transmitted, is initially transmitted, then immediately repeated three times in complete form, and then repeated again but not in complete form. FIG. 2(c) shows that code X consists of a sequence of four words, the first word being an m-bit start word SW common to all of the remote control functions, the second word being an n-bit message word MWX peculiar to the remote control function X, and the third and fourth words CSW and CMWX being the complements of the start and message words, respectively. FIG. 2(d) shows that the four words SW, MWX, CSW and CMWX are each five-bit binary coded words. FIG. 2(e) shows the code, CODE X, represented as a waveform containing, within a constant bit period, a short pulse for binary bit 0 and a long pulse for binary bit 1.

It is assumed that the time t4 is 160 milliseconds and contains 20 bit periods which are each of 8 milliseconds duration.

That means each bit period is 8 milliseconds and is itself divided into 6 periods x of a duration of 1.33 milliseconds each.

This is shown in FIG. 2(f) wherein one bit period of 8 milliseconds is indicated by 6x.

Now, a short pulse for a binary bit 0 has a duration of one sixth (1/6=x) of this bit period, i.e. x=1.33 milliseconds, and a long pulse for a binary bit 1 has a duration of four sixths (4/6=4x) of the bit period i.e. 4x=5.33 milliseconds.

This is shown in FIG. 2(f) wherein the original information has two discrete parameters, namely a high level and a low level. For the binary bit 0, the high level lasts for x milliseconds and the low level lasts for 5x milliseconds.

For the binary bit 1, the high level lasts for 4x milliseconds and the low level lasts for 2x milliseconds.

Now, in accordance with this invention, these high and low level parameters, which represent the signal of FIG. 2(e), are transmitted, in case an ultrasonic wave is used as the carrier for transmitting the information, whereas, in case of infra-red transmission not, these high and low level parameters are not transmitted but, as will be explained more fully hereinafter with the aid of the embodiment of FIG. 3(a), for a binary bit 0, very short pulses R' and S' are transmitted (see FIG. 2(g)) and for a binary bit 1, very short pulses R' and T' are transmitted. Thus the original pulse duration signal as shown in FIG. 2(e) and 2(f) is converted into a pulse position modulation signal as shown in FIG. 2(g). Therefore pulses R' indicate, each time, the beginning of the high level, whereas pulses S' and T' respectively indicate the beginning of the low level and, at the same time, the end of the high level.

In this way, the same integrated circuits (IC) can be used both at the transmitter and at the receiver, independent of whether ultrasonic or infra-red transmission is used.

Figure 3:
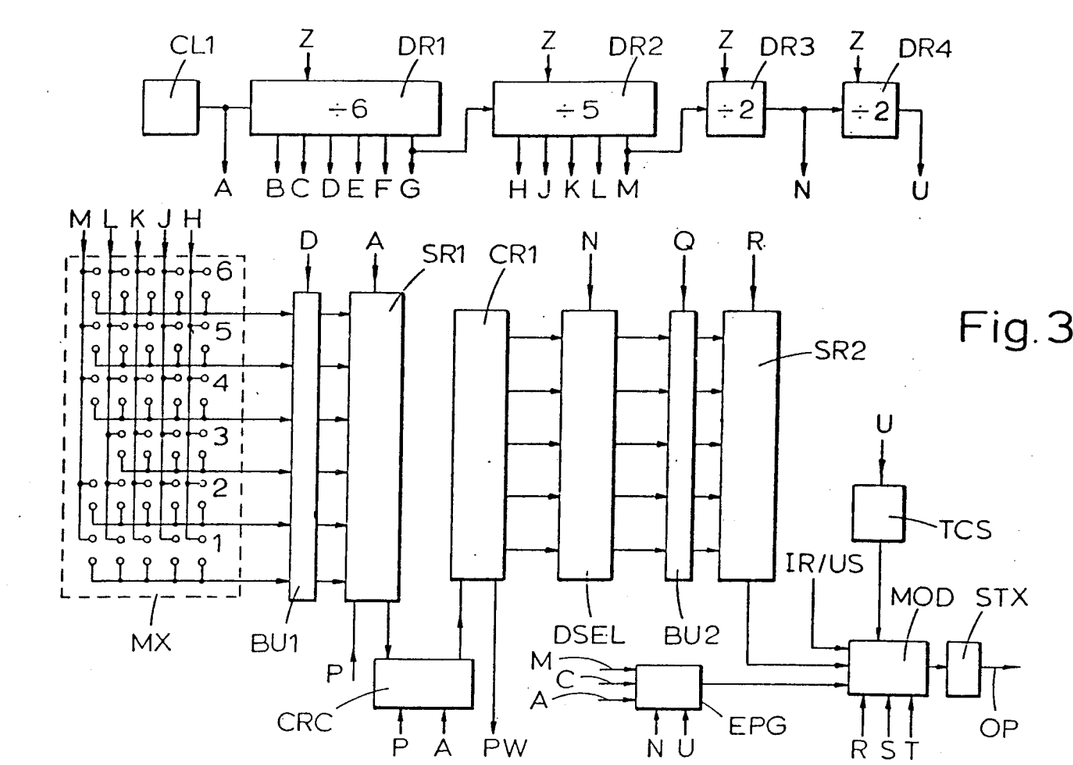
FIG. 3 shows a more detailed block diagram of the transmitter coder of the system of FIG. 1.
Figure 3A:
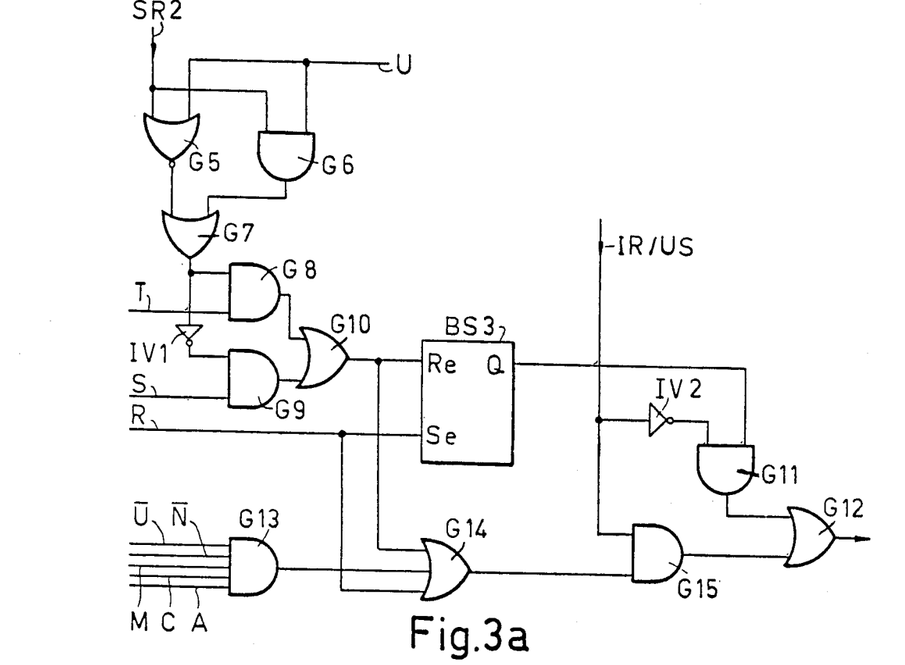
FIG. 3a shows in further detail, a part of the transmitter encoder of FIG. 3.
Figure 5:
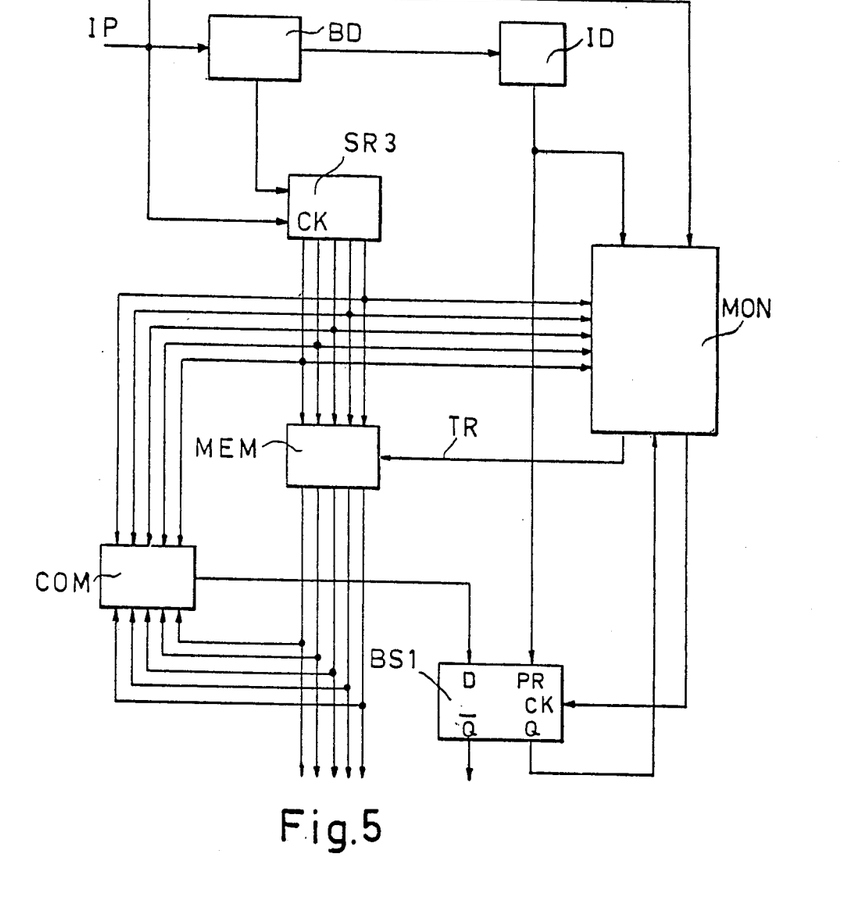
FIG. 5 shows a more detailed block diagram of the receiver decoder of the system of FIG. 1.
Figure 5A:
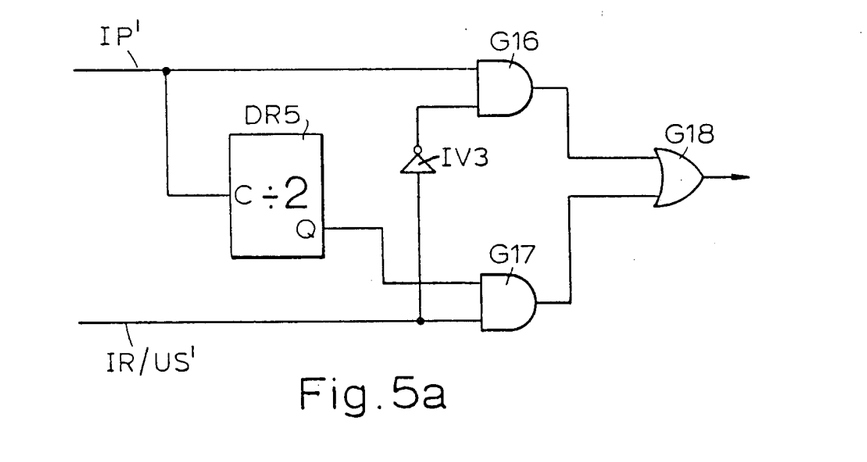
FIG. 5a shows in further detail, a part of the receiver decoder of FIG. 5.

Only one additional bit information (a 0 or a 1) need be given on the input terminal IR/US (see FIGS. 3, 3(a) and 5(a)) in order to indicate whether an infra-red or an ultrasonic carrier is used.

FIG. 2(h) shows the true transmitted short pulses when an infra-red beam is used, whereas FIG. 2(j) shows the true transmitted signal in case of an ultrasonic beam.

FIGS. 2(k) and 2(l) will be explained more fully hereinafter.

The complete waveform shown in FIG. 2(e) is the output of the coder C of the transmitter shown in FIG. 1 for each time period t4 when the remote control function X is selected by the function selection unit F.

For transmission, the waveform of FIG. 2(e) is converted by the circuit M and the transmitter element TX into short bursts of infra-red energy or relatively longer bursts of ultrasonic energy.

Figure 4:
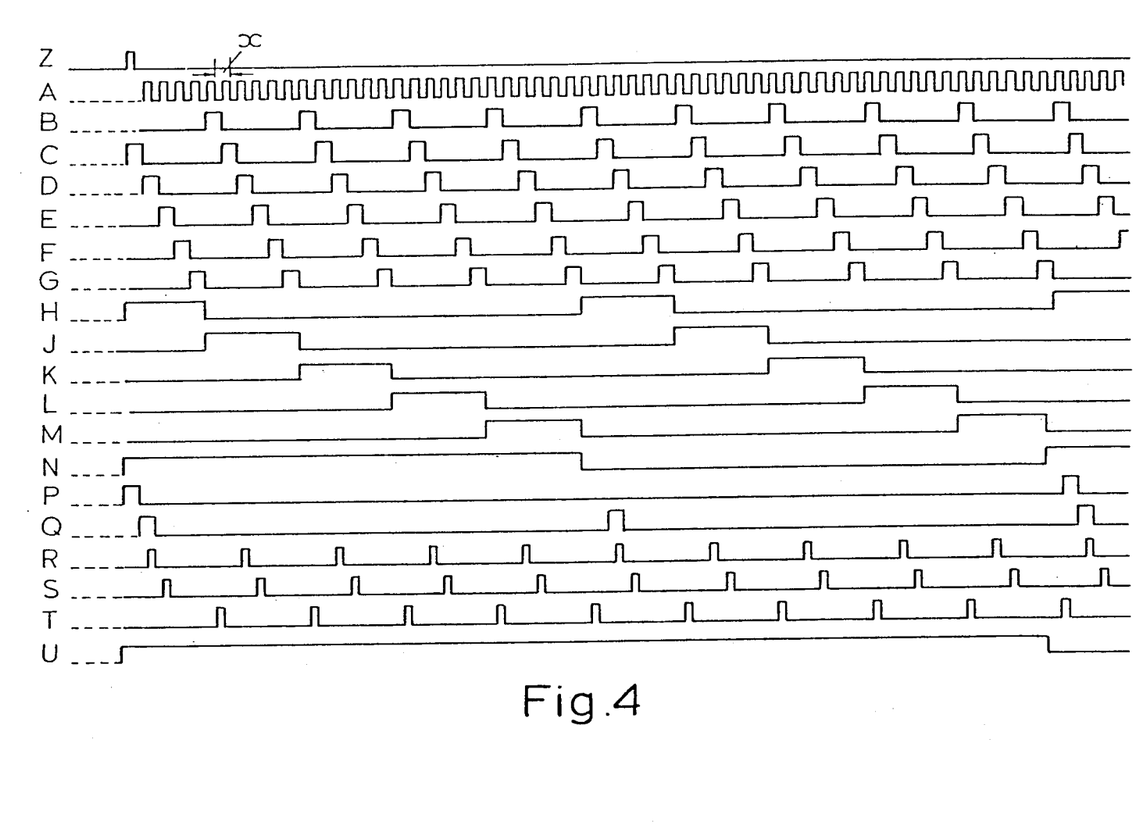
FIG. 4 shows waveforms used in the coder of FIG. 3.

Referring now to FIGS. 3 and 4, there is shown a circuit and waveform, respectively, of the coder C of the transmitter shown in FIG. 1. Timing control means in the coder includes a clock pulse source CL1, a divide-by 6 circuit DR1, a divide-by 5 circuit DR2, and two divide-by 2 circuits DR3 and DR4. The clock pulse source CL1 produces a square pulse waveform A of period 1.33 miliseconds, which period will hereinafter be referred to as x. Circuit DR1 produces six pulse waveforms B, C, D, E, F and G each having a pulse width x and period 6x. Circuit DR2 is fed from waveform G and produces five pulse waveforms H, J, K, L, and M each having a pulse width 6x and period 30x. Circuit DR3 is fed from waveform M and produces a square pulse waveform N of period 60x, and circuit DR4 is fed from waveform N and produces a square pulse waveform U of period 120x. Gating circuits (not shown) are used to derive further pulse waveforms P=C·H·N, Q=D·H, R=A·D, S=A·E and T=A·B.

A message encoder provides, in response to the operation by a user of the function selection unit F shown in FIG. 1, a five bit binary coded message word appropriate to the selected remote control function. This message encoder consists of a crosspoint matrix MX, whose condition is rendered unique to the selected remote control function in response to the operation of the function selection unit F, a buffer unit BU1, a six-stage parallel-to-serial input shift register SR1, a five stage counter CR1 and a counter control circuit CRC.

The cross-point matrix MX consists of five columns to which the waveforms H, J, K, L and M, and are fed, respectively, and six rows which lead via the buffer unit BU1 to the six stages, respectively, of the input register SR1. Each cross-point (except one, for a reason which will be explained later) is provided with a pair of contacts, and the function selection unit F is arranged (by means not shown) so that, for the time during which a particular one out of twenty-nine possible remote control functions is selected, one pair of contacts in the matrix MX corresponding to that function is closed. The timing control is arranged to shift the condition of each cross-point of the matrix MX in turn through the register SR1 and to count the counter CR1 until the counter CR1 contains a message word corresponding to the selected function and is stopped.

The time taken to put a message word in the counter CR1 is a maximum of 30x.

A data selector DSEL is arranged to enable a five-stage parallel-to-serial output shift register SR2 to be loaded via a buffer unit BU2 with either a message word from the counter CR1 or a fixed five bit binary coded start word contained in the circuit DSEL. A modulator circuit MOD is controlled by the output of the output shift register SR2 by the output of a true-complement selector TCS, and the output of an extra pulse generator EPG. The modulator circuit MOD feeds an output energy transmitter stage STX which produces bursts of infra-red or ultrasonic energy at its output OP.

In response to continued operation of the function selection unit F, the timing control means continuously shifts the shift register SR2 and controls the data selector DSEL, the true-complement selector TCS and the extra pulse generator EPG so that the modulator circuit MOD provides a pulse output corresponding to immediately successive binary bits which form a repetitive message sequence of four words; the first word of each message sequence being the start word, the second word being the appropriate message word, and the third and fourth words being the complements of the start and message words, respectively.

Each such message sequence is produced during a time of 120x, i.e. 30x for each word. An example of a waveform for one such message sequence is shown in FIG. 2(e), as aforesaid.

A more detailed description of FIGS. 3 and 4 will now be given.

When the user first selects a remote control function, closure of one of the pairs of contacts in the matrix MX, connects power to the transmitter and produces a waveform Z which presets the circuit DR1 to C and clears B, D, E, F and G, presets the circuit DR2 to H and clears J,K,L, and M, and presets the circuit DR4 to U. A pulse waveform P=C·H·N clears the last stage of the shift register SR1 to 0 and enables the counter control circuit CRC to clear the counter CR1 to 00000.

During the time zero to 30x following the pulse P, the start word 00101 is produced as follows. The condition N makes the start word available from the data selector DSEL to the buffer unit BU2. The pulse waveform Q=D·H then parallel loads the five stage output shift register SR2 with the start word, and the pulse waveform R=A·D, which has a period 6x, shifts the start word from the register SR2 to the modulator circuit MOD during the period 30x. The modulator circuit MOD is responsive to a pulse R at the beginning of each bit period of 6x to supply a pulse output to the transmitter stage STX and is then further responsive to a pulse waveform S=A·E after a time x corresponding to a binary bit 0, or to a pulse waveform T=A·B after a time 4x corresponding to a binary bit 1, to terminate the pulse output to the transmitter stage STX. One of the pulse waveforms S or T is gated for each bit according to the output of the shift register SR2 and the output of the true-complement selector TCS. The pulse waveform U ensures that during the first time period 30x the pulse output, with respect to the true start word, is being produced from the modulator circuit MOD.

During the time zero to 30x following the pulse waveform P, while the start word is being dealt with by the modulator circuit MOD, the message word is put into the counter CR1 as follows. The pulses of the waveform D load the 6-stage input shift register SR1 at intervals of 6x, and the entire contents of the shift register SR1 is shifted by the clock pulse waveform A into the counter control circuit CRC during each period of 6x. During each pulse of the waveform D, a pulse from one of the waveforms H, J, K, L, and M will be applied to a respective one of the five columns of the matrix MX. If none of the pairs of contacts in a column of the matrix MX is closed when a pulse from the respective waveform H, J, K, L or M is applied to that column, then the pulse of the waveform D occurring during the pulse, will load five zeros, 00000, into the shift register SR1. Depending on which one of the pairs of contacts of the matrix MX is closed, corresponding to a particular selected function, then a 1 will be loaded into the stage of the shift register SR1 corresponding to the row of the matrix MX containing that closed contact pair by a pulse of the waveform D when a pulse from the respective waveform H, J, K, L, or M is applied to the column containing that closed contact pair. When that 1 is shifted from the register SR1 to the counter control circuit CRC, the clock pulse waveform A inhibits the counter control circuit CRC from counting the counter CR1 and the counter CR1 is stopped. The counter CR1 then contains a five bit binary coded message word corresponding to the selected function. If the contact pair on row 1 of column H is closed, the first bit shifted from the register SR1 is a 1, the counter CR1 is prevented from starting and the message word is 00000. If, for example the contact pair of row 5 on column J is closed, then the eleventh count of the counter CR1 is inhibited and the message word is 01010. No pair of contacts is present on row 3 of column M because this would give a message word which is reserved for the complement start word, i.e. 11010. The data selector DSEL is arranged so that when the counter CR1 has a message word which is 1010X, where X is 1 or 0, it is changed to the word 11111 or 11110 which are words not produced from the matrix MX.

During the time 30x to 60x following the pulse waveform P, the message word in the counter CR1 is produced as follows. The condition $\overline{N}$ makes the message word in the counter CR1 available via the data selector DSEL to the buffer unit BU2. The pulse waveform Q=D·H then parallel loads the shift register SR2 with the message word and the pulse waveform R=A·D shifts the message word from the register SR2 to the modulator circuit MOD, which is responsive, in the same manner as for the start word, to produce a pulse output for each bit of the message word. The waveform U ensures that during the time 30x to 60x the true message word is being dealt with by the modulator circuit MOD.

At the time 60x after the first pulse of the waveform P, the next pulse of the waveform P is produced which clears the last stage of the shift register SR1 to 0 and enables the counter control circuit CRC to clear the counter CR1 to 00000.

During the time 60x to 120x the same conditions apply as during the time zero to 60x except that the condition $\overline{U}$ complements the gating in the modulator circuit MOD. Thus, during the time 60x to 90x, the complement start word 11010 is being dealt with by the modulator circuit MOD. Also, the same message word as was put into the counter CR1 during the time zero to 30x is again put into the counter CR1 during the time 60x to 90x. This assumes that the same remote control function is being selected, which is a safe assumption since it is within human reaction time and so the user will be waiting to see the result of his selection. During the time 90x to 120x, the complement message word is being dealt with by the modulator circuit MOD.

So long as the user continues to select the same remote control function, the process will continue, repeating the same sequence of four words every 120x. When a remote control function is no longer selected the shift register SR1 will not have a 1 loaded into it from any of the five columns of the matrix MX. The counter CR1 will, as a result, count up to 31, i.e. 11111, and on this count will give a signal PW which switches off the transmitter. It will be noted that if two remote control functions are simultaneously selected by the user then the one which closes that pair of contacts in the matrix MX which first loads a 1 into the shift register SR1 will take precedence and the other one will be ineffective.

As will be described, a "select" input IR/US to the modulator circuit MOD determines the form of pulse output from the modulator circuit MOD to the transmitter stage STX according to whether the latter has an infra-red or an ultrasonic transducer for the transmission of remote control function message sequences to the receiver. Depending on which form of transmission is used, the initial processing of the transmitted energy at the receiver differs, as will also be described. However, for the present, for an understanding of the logic operations of the receiver, it need only be appreciated that there is produced at the input to the receiver decoder a waveform, such as the one shown in FIG. 2(e), which corresponds to the original waveform for the message sequence and from which the pulse output supplied by the modulator circuit MOD is produced.

In FIG. 5 there is shown a block circuit diagram of the decoder D which forms part of the receiver in the system of FIG. 1. The input IP in FIG. 5 will be a waveform of short data pulses as shown in FIG. 2.

Referring now to FIG. 5, a bit discriminator BD produces, from the input waveform IP, 0 and 1 binary bits suitable for application to a five-stage, serial-to-parallel converter shift register SR3 which is clocked by the input waveform IP. An output of the bit discriminator BD is also fed to an interrupt detector ID which provides an output responsive to an interruption in the detection of immediately successive binary bits by the bit discriminator BD. The bit discriminator BD and the interrupt detector ID will be described later in more detail with reference to FIG. 6. The contents of the shift register SR3 are continuously applied to a monitoring unit MON, and to a comparator unit COM, and are also transferred into a store MEM by an output signal TR from the monitoring unit MON. The contents of the shift register SR3 are continously compared with the contents of the store MEM in the comparator unit COM. The result of the comparison is applied by the comparator unit COM to the D input of a bistable circuit BS1, and when the contents of the shift register SR3 are the complement of the contents of the store MEM, a 0 is applied to the D input. The D input is transferred to the outputs of the bistable circuit BS1 when an output from the monitoring unit MON is applied to the clock input CK of the bistable circuit BS1, and, if a 0 is so transferred, then the $\overline{Q}$ output of the circuit BS1 becomes 1 and the Q output becomes 0. The $\overline{Q}$ output of the bistable circuit BS1 and the contents of the store MEM are supplied to the interface circuit IF(FIG. 1), which is responsive to accept the contents of the store MEM, to provide a remote control function when the $\overline{Q}$ output is a 1 and to disable the contents of the store from providing a remote control function when it is a 0. The Q output of the bistable circuit BS1 is applied to the monitoring unit MON and inhibits it from providing, or enables it to provide, an output signal TR according to whether that Q output is a 0 or a 1, respectively.

Figure 7:
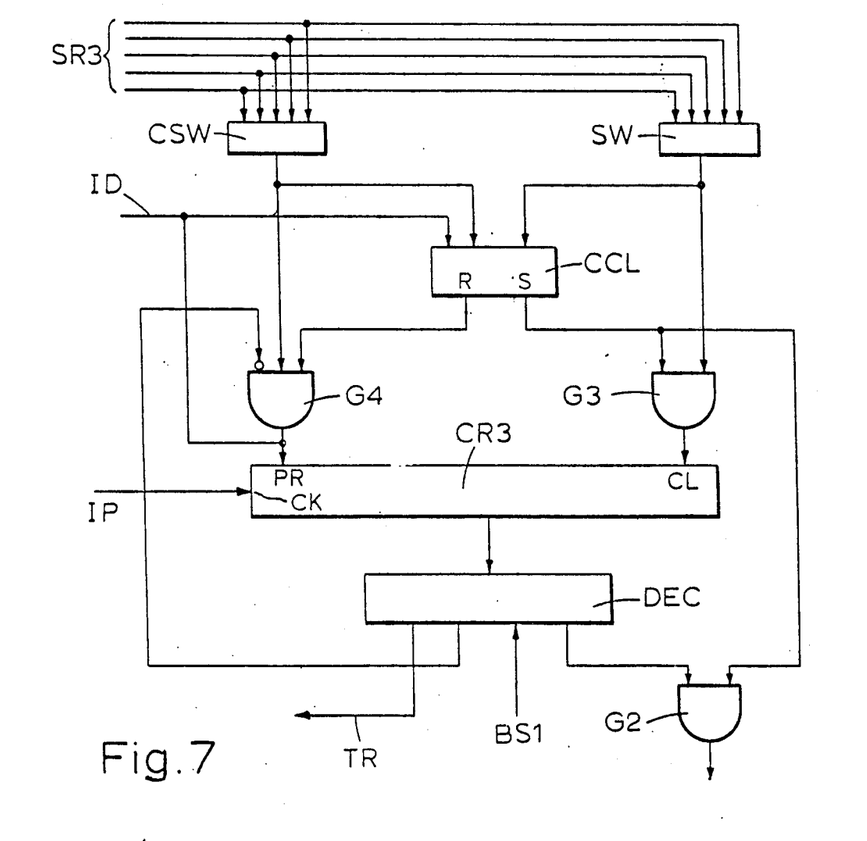
FIG. 7 shows a more detailed block diagram of the monitoring unit which forms part of the decoder of FIG. 5.

The monitoring unit MON, which will be described in more detail later with reference to FIG. 7, is clocked by the input waveform IP. It is also adapted to recognize either a start word or a complement start word in the input shift register SR3, i.e. it can be set to recognise one or the other at a time. The output of the interrupt detector ID is connected to the monitoring unit MON and to an input PR of the bistable circuit BS1. An output from the interrupt detector ID, in response to an interruption in the detection of immediately successive binary bits by the bit discriminator BD, will set the monitoring unit MON to recognize a start word, and will provide a 0 on the $\overline{Q}$ output (disable remote control function) and a 1 on the Q output (enable output signal TR) of the bistable circuit BS1. The result of the above arrangement is that the monitoring unit MON will provide an output signal TR in response to the recognition of a start word which has followed an interrupt output from the interrupt detector ID and which is followed by the detection of five binary bits in the input waveform IP, and the monitoring unit MON will provide a signal to the clock input CK of the bistable circuit BS1 in response to the recognition of a start word followed by the detection of five bits followed by the recognition of a complement start word followed by the detection of a further five bits.

Thus the receiver is adapted to be reset by an interruption in the receipt of signals corresponding to immediately successive binary bits and is adapted so that, after being reset, when signals are next received which correspond to an uninterrupted sequence of bits, said sequence of bits consisting of a start word followed by five bits followed by a complement start word followed by the complement of five bits, then a remote control function is enabled corresponding to the message word constituted by the five bits following the start word.

Furthermore, the receiver is thus adapted so that once a particular remote control function has been enabled, it is then disabled only by the receiver being reset or otherwise by the receipt of signals which correspond to an uninterrupted sequence of bits consisting of a start word followed by five bits followed by a complement start word followed by a further five bits, which further five bits are not the complement message word corresponding to the particular remote control function which has been enabled.

Figure 6:
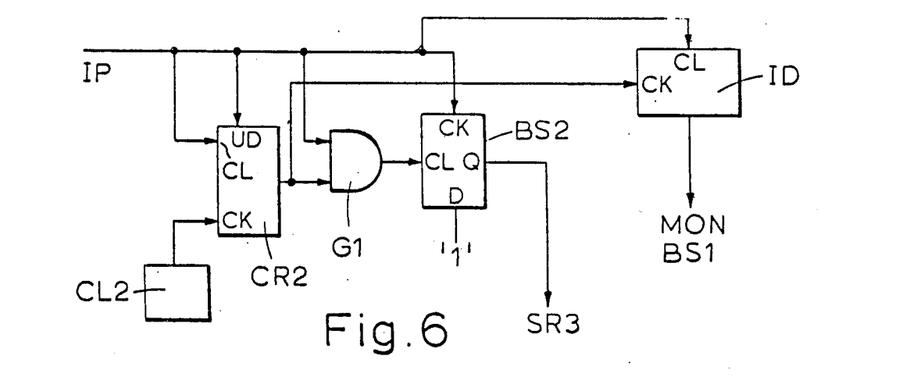
FIG. 6 shows a more detailed block diagram of the bit detector which forms part of the decoder of FIG. 5.

The bit discriminator BD of the decoder shown in FIG. 5 is shown in more detail in the block circuit diagram of FIG. 6. Referring now to FIG. 6, and up/down counter CR2 counts in response to pulses applied to its clock input CK from a clock pulse generator CL2. In the case where the bit period of the input waveform IP is a nominal 8 milliseconds, a 4 kHz clock pulse generator CL2 and a 6-bit binary counter and a 6-bit binary counter CR2 would be adequate.

However, if an 8-bit binary counter is used, bit periods much greater than 8 ms can be accomodated.

The input waveform IP is applied to a clear input CL and to the up and the down inputs UD of the counter CR2 such that the counter CR2 responds to the beginning of a waveform pulse, i.e. a positive edge, to commence counting up from clear condition and responds to the end of a waveform pulse, i.e. a negative edge, to commence counting down. A bistable circuit BS2 responds to the end of a waveform pulse, i.e. a negative edge of the input waveform IP supplied to its clock input CK, to enable either a 1 or a 0 bit to be fed into the input shift register SR3 at the beginning of the next waveform pulse according to whether or not the counter CR2 has counted down to the clear condition before the beginning of the next positive edge of the input waveform IP. That is to say, the negative edge at the end of each waveform pulse will clock a permanent '1' on a D input of the bistable circuit BS2 through to the Q output which is fed to the input shift register SR3. If the input waveform pulse is a short pulse corresponding to a 0, then the counter CR2 will count down to the clear condition before the beginning of the next input waveform pulse. In this case, an AND-Gate G1 responds to the clear condition of the counter CR2 and the low level of the input waveform IP to apply a 0 to the clear input of the bistable circuit BS2, and this 0 is transferred to the Q output of the bistable circuit BS2 over-riding the 1 which was clocked through from the D input. If the input waveform pulse is a long pulse corresponding to a 1 then the counter CR2 will not count down to the clear condition before the beginning of the next input waveform pulse, and in this case the 1 which was clocked through from the D input will not be over-ridden. The particular realisation of the bit discriminator BD described above is not essential but it will be appreciated that with it, the system will not be adversely affected by small variations from specified clock frequencies used in the transmitter and the receiver.

The sequence of events, in the counter CR2, with a continuous bit stream is as follows: clear, count up, count down, perhaps pass once through clear (which event can be called "Down Zero"), Clear, Count up, Count down, etc. The number of times "Down Zero" occurs between each clear is thus either nought or one. Two or more "Down Zeroes" occur only if the reception of bits has ceased, that is a long period of count down. The interrupt detector ID, which is a count-2 counter, gives an output in response to two consecutive "Down Zeroes". If the input IP maintains a high level for a long period then what will be termed an "Up Zero" condition occurs in which the count passes through the clear condition while counting upwards. Two or more "Up Zeroes" also cause the interrupt detector ID to give an output.

The monitoring unit MON, which forms part of the decoder shown in FIG. 5, is shown in greater detail in the block schematic diagram of FIG. 7. Referring now to FIG. 7, a start word detector SW and a complement start word detector CSW are connected to receive the contents of the input shift register SR3. A latching circuit CCL gives an output from its set output S in response to an output from the interrupt detector ID corresponding to an interruption in the detection of immediately successive bits or in response to the detection of a complement start word by the complement start word detector CSW. The latching circuit CCL gives an output from its reset output R in response to the detection of a start word by the start word detector SW. A divide-by-twenty counter CR3 is clocked by the input waveform IP. The monitoring unit further includes a detector DEC which detects counts of five, ten and fifteen from the counter CR3 and an AND Gate G2. The counter CR3 is stopped and preset to all 1's in response to an output from the interrupt detector ID, corresponding to an interruption in the detection of immediately successive bits, applied to the preset input PR. The counter CR3 is cleared to all 0's and enabled to start counting by a signal applied to its clear input CL from an AND Gate G3 in response to the latching circuit CCL being in its set condition and the detection of a start word from the start detector SW. The detector DEC detects a count of five from the counter CR3 to give the output signal TR, unless a 0 is present on the Q output of the bistable circuit BS1 in which case the output signal TR is inhibited. The detector DEC detects a count of ten to give an output signal which is applied to an inhibit input of an AND Gate G4 whose output is connected to the preset input PR of the counter CR3. The counter CR3 will be stopped and preset to all 1's by a detect-ten output from the detector DEC unless the latching circuit CCL is in its reset condition and a complement start word is detected by the complement start word detector CSW. The detector DEC also detects a count of fifteen to give an output signal to the AND Gate G2. The AND gate G2 provides an output signal to the clock input of the bistable circuit BS1 if the detector DEC detects fifteen and the latching circuit CCL is in its set condition. The counter CR3 is also arranged to be stopped and preset to all 1's when it has counted to twenty.

Referring now to both FIGS. 5 and 7, their operation may now be summarised as follows.

An interruption in the detection of immediately successive bits in the input waveform IP will give an output from the interrupt detector ID which is applied to the preset input PR of the bistable circuit BS1 to give a disable output. The output from the interrupt detector ID is also applied to the preset input PR of the counter CR3 to stop the counter and preset it to all 1's and is applied to the latching circuit CCL to set it. The counter CR3 is then cleared to all 0's and starts counting when a start word is detected by the start word detector SW. Since there is a 1 on the Q output of the bistable circuit BS1, the signal TR is applied, after the detection of five further bits, to the store MEM so that these five further bits (a message word) are transferred from the input shift register SR3 to the store MEM. If, when a further five bits have been detected, these further five bits are detected as a complement start word by the complement start word detector CSW, then the counter CR3 continues counting. If a complement start word is recognised by the complement start word detector CSW at any time other than ten bits after the detection of a start word, the counter CR3 will be stopped and preset. If a further five bits are detected, then the AND gate G2 provides a signal to the clock input CK of the bistable BS1, and, if at that time the comparator unit COM gives a 0 signal to the D input of the bistable circuit BS1, indicating that the contents of the shift register SR3 are the complement of the contents of the store MEM, then a 1 on the $\bar{Q}$ output of the bistable circuit BS1 enables the contents of the store MEM to perform a remote control function.

Thus after an interruption in the sequence of detected bits, only a correct sequence of twenty bits will enable a remote control function. That is to say, the receiver will not give an incorrect response, i.e. enable a remote control function other than the one selected if, when a user initially selects a particular remote control function, the appropriate code is incorrectly sent from the transmitter or is degraded in its transmission to the receiver.

Once a particular remote control function has been enabled, then it will be disabled only by an interruption in the sequence of detected bits or by the receipt of a start word followed by five bits followed by a complement start word followed by five bits which are not the complement of the five bits in the store MEM. In the latter case, a signal will be applied by the gate G2 of the monitoring unit MON to the clock input CK of the bistable circuit BS1, but a 1 will be applied to the D input of the bistable circuit BS1 by the comparator unit COM and so a 0 will appear on the $\bar{Q}$ output of the bistable circuit BS1 to disable the remote control function. Thus the receiver ensures that once a selected remote control function has been enabled, then it is unlikely to be disabled or changed by degration of the code in the transmission path while that same remote control function is continuously selected at the transmitter.

The modulator circuit MOD, the True Complement Selector TCS and the Extra Pulse Generator EPG of the coder shown in FIG. 3 can be the logic circuit arrangement as shown in FIG. 3a, in which it is assumed that on each input and output lead of the various gates either a logic 1 (high level) or a logic 0 (low level) is obtained. This logic circuit arrangement comprises a NOR-gate G5 and an AND-Gate G6 to both of which the waveform U is applied and also to both of which the output from the shift register SR2 is applied. The gates G5 and G6, which supply true and complement data, respectively, feed an OR-gate G7 which produces a logic 1 in response to a logic 1 from either gate G5 or G6. Gate G5 produces a logic 1 when its SR2 input and its U input are both a logic 0 and gate G6 produces a logic 1 when both these corresponding inputs are a logic 1. The gate G7 feeds one input of an AND-Gate G8 directly and one input of an AND-Gate G9 via an inverter IV1. The waveform T is applied to a second input of the gate G8 and the waveform S is applied to a second input of the gate G9. Both of the gates G8 and G9 feed an OR-gate G10, the output of which is connected to a reset input Re of a bistable circuit BS3. A set input Se of the bistable circuit BS3 has the waveform R applied to it. In response to each pulse of waveform R, the bistable circuit BS3 is set to produce a logic 1 at its output Q and is then reset by a logic 1 applied to its reset input Re from gate G10 either after a time x or after a time 4x, depending on whether a binary bit 0 or a binary bit 1 is being supplied by the shift register SR2, as determined by the occurence of a pulse of waveform S or waveform T. The output Q of the bistable circuit BS3 is connected to one input of an AND-Gate G11, and the "select" input IR/US is connected to a second input of the gate G11 via an inverter IV2. For ultrasonic transmission, the "select" input IR/US has a logic 0 applied to it, so that gate G11 produces a logic 1 output for the period that the bistable output Q is at logic 1. The output from gate G11 is applied via an OR-Gate G12 to feed the output energy transmitter stage STX. For ultrasonic transmission, the transmitter stage STX would comprise an amplifier and oscillator circuit and an ultrasonic output transducer. An ultrasonic frequency of 40 KHz would be suitable. The output of gate G12 to the transmitter stage STX is represented in FIG. 2(f) for a binary bit 0 and a binary bit 1, respectively, and the resulting ultrasonic transmission is represented in FIG. 2(j).

The logic circuit arrangement further comprises an AND-Gate G13 which forms the extra pulse generator EPG, an OR-Gate G14 and a further AND-Gate G15. For infra-red transmission, the "select" input IR/US has a logic 1 applied to it, and this logic 1 is fed to one input of the gate G15. A second input of the gate G15 is fed by the output from the gate G14 which receives a pulse from the waveform R followed by the logic 1 input from gate G10 which occurs, as before, at a time corresponding to a pulse of waveform S or waveform T. Gate G11 is disabled because of the logic 1 on the "select" lead IR/US, and gate G15 feeds the pulse output of gate G14 via gate G12 to the transmitter stage STX. In this instance, the transmitter stage STX would comprise an amplifier and differentiator circuit and an infra-red output transducer. An infra-red carrier wavelength of approx 1.00 μm and a transmitted pulse width of 5 to 30 μs would be suitable. The output of gate G12 to the transmitter stage STX is represented in FIG. 2(g) for a binary bit 0 and a binary bit 1, respectively, and the resulting infra-red transmission is represented in FIG. 2(h). Thus, two pulses R', S' now represent a binary bit 0 and two pulses R', T' now represent a binary bit 1.

In FIG. 2(g), there is shown at the pulse position 5x in both the binary bit 0 and the binary bit 1 period an extra pulse EP. This extra pulse is produced by the gate G13 in response to inputs $\overline{U}$, $\overline{N}$, M, C and A, and occurs in the last bit period of alternate message sequences transmitted. It is shown twice in FIG. 2(g) merely to illustrate that this extra pulse EP occurs in the same pulse position 5x regardless of whether the last bit is a 0 or a 1. The purpose of the last bit is to cause the phase of alternate message sequence, as reconstituted in the receiver, to be inverted so that each alternate message sequence is correctly reconstituted. As will be described, without the additional pulse EP, the waveform of the message sequence reconstituted in the receiver could be permanently out of phase so that the receiver could not decode it to perform the appropriate control function.

Figure 3B:
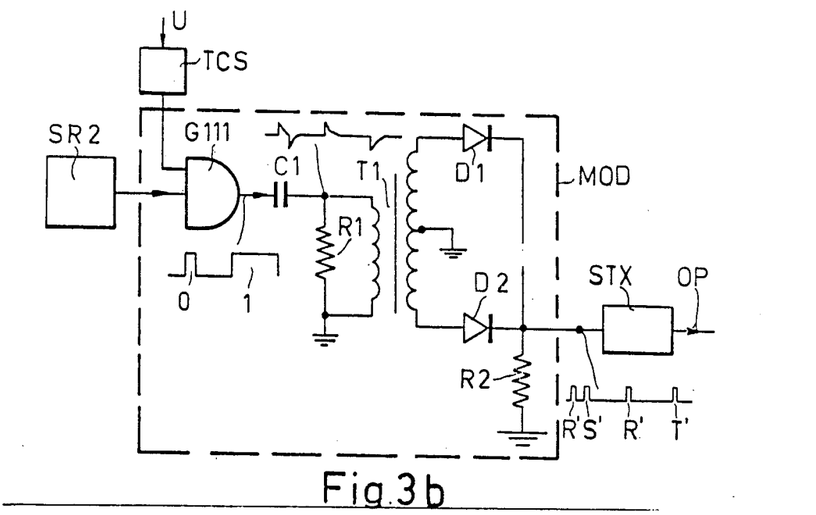
FIG. 3b shows another embodiment of a part of the transmitter encoder of FIG. 3.

Instead of arranging the modulator MOD in a way as shown in FIG. 3(a), it can be done in a way as shown in FIG. 3(b).

In FIG. 3(b) the modulator MOD comprises an AND-Gate G111 to a first input terminal of which is applied the output signal of the shift register SR2 and to a second input terminal of which is applied the output signal of the True Complement Selector TCS. The output terminal of AND-Gate G111, delivering the pulse duration signal, is connected to a differentiating network formed by capacitor C1 and resistor R1. The time constant $C_1R_1$ is chosen such that the said differentiating network is capable of differentiating each edge of the incoming pulse duration signal so that short pulses of 5–30 μs are developed across $R_1$. The signal across $R_1$ is applied to the primary winding of a transformer $T_1$. The central tap of the secondary winding of $T_1$ is grounded, whereas the two outer ends thereof are connected to the anodes of two diodes $D_1$ and $D_2$, respectively. The two cathodes of $D_1$ and $D_2$ are connected together and grounded via a resistor $R_2$. Thus the negative going pulses of the differentiated signal are phase inverted by said double side rectifier circuit formed by $T_1$, $D_1$, $D_2$ and $R_2$ and hence the pulse position modulator signal is developed across $R_2$. The output signal as developed across $R_2$ is applied to device STX.

The logic circuit arrangement shown in FIG. 5(a) is provided at the input of the receiver to reconstitute a received transmission into a decodable message sequence of the form shown in FIG. 2(e). This logic circuit arrangement comprises a divide-by-two ($\div 2$) circuit DR5, two AND-Gates G16 and G17, an OR-Gate G18 and an inverter IV3. A "select" lead IR/US' applied a logic 1 to one input of the gate G17 for infra-red reception and a logic 0 for ultrasonic reception. Thus, the gate G17 produces an output only for infra-red reception. An input lead IP' has applied to it from a receive transducer (ultrasonic or infra-red as the case may be) pulses representing the binary bits of a received message sequence. These pulses are applied as logic 1's to one input of the gate G16 and to a clock input C of the divide-by-two circuit DR5. A Q output of the circuit DR5 is connected to a second input of the gate G17. For ultrasonic transmission the logic 0 on lead IR/US' is inverted by the inverter IV3 to apply a logic 1 to a second input of the gate G16. Thus, for ultrasonic reception, the output of gate G16, as applied via gate G18 to the input IP (FIG. 5) of the receiver, comprises a sequence of short and long pulses representing binary bits 0 and 1 as represented in FIG. 2(f). For infra-red reception, gate G17 produces a similar output, being responsive for each period that output Q of the circuit DR5 has a logic 1 on it.

In principle, synchronisation between transmitter and receiver could be done with the aid of pulses R' because they always occur at a determined distance of 6x milliseconds. However, under such circumstances, there is a probability that the first pulse applied to the clock input C of the circuit DR5, at the commencement of a remote control operation, may correspond to either an 'S' pulse of a T' pulse instead of an R' pulse (see FIG. 2(g)). If this is the case, then the ouput from gate G17 becomes inverted logic which cannot be decoded in the receiver. This is the reason for providing the extra synchronising pulse EP between the pulses of alternate message sequences. Consideration of the presence of the extra pulse EP will show that it ensures that the output from gate G17 becomes inverted with respect to each alternate message sequence which, accordingly, has to be transmitted at least twice, as aforesaid, to ensure that it is received correctly at least once.

The receiver ingnores the inverted logic because, as will now be explained with reference to FIGS. 2(k) and 2(l), the inverted logic cannot perform a bone fide start word, provided the start word has at least a 010 sequence in it. Referring to FIG. 2(k), the four possible bit sequences 0→0, 0→1, 1→1, 1→0 are shown in inverted logic il. In the receiver, a binary bit 1 is detected when the high level portion of a bit period is longer than the low level portion, and a binary bit 0 is detected when the low level portion is longer than the high level portion. Thus, in the receiver the inverted logic sequence 00110 (il) of FIG. 2(k) is interpreted as output logic 01, 1, 1, 0, 1 . . . . As indicated, it can be seen that for a logic 0 to be formed in the output logic 01, the low level portion L must be greater than the high level portion H (i.e. $L > H = O$), which is not possible following an inverted 1. As shown in FIG. 2(l), the reverse argument also applies in that a 101 sequence cannot be formed in the output logic (01) from inverted logic (il) when the low level portion of a true 0 is shorter than the high level portion of a true 1. As a general rule, it may be said that if an inverted bit comprising the second portion of a true 0 and the first portion of a true 1 is interpreted by a receiver as a 1, then the sequence 010 cannot be formed with the inverted logic. Similarly, if such an inverted bit is interpreted as a 0, then the sequence 101 cannot be formed with the inverted logic.

To increase the security of a system embodying the invention, the number of bits in the start word can be increased, for instance to 7. Thus a start word code may be 1101010, which contains the 010 sequence twice.

A message word which is enabled will be decoded in the interface circuit IF of FIG. 1 to perform the corresponding remote control function. In a television set, some of the message words could be used for TV channel selection by using the most significant bit of the message word to denote either IV channel selection as such or some other function. If TV channel selection is denoted then the other bits of the message word can denote the particular TV channel and can be used, for example, to first select a predetermined TV channel and to preset a counter to a respective value, so that the number of counts of the counter from that respective value to a predetermined value will then determine the number of TV channels which are stepped through so that the desired TV channel is reached. If the most significant bit of the message word denotes a function other then TV channel selection, then the other bits of the message word will be decoded to determine that particular function e.g. whether a change in colour, volume or brilliance is desired and whether that change is to be up or down. The decoded bits can enable a selected counter to count up or down under the control of a slow clock. The value held in the selected counter can be continuously compared with the value of another counter which is under the control of a fast clock. This other counter can set and reset a bistable circuit when its value reaches a predetermined value and the value in the selected counter respectively, thus giving a pulse waveform output whose mark-to-space value depends on the value in the selected counter. This pulse waveform is integrated with a capacitor to provide a current in a control circuit whose value depends on the mark-to-space ratio. The value in the slowly clocked counter for each function can be preset to a mean value which determines a 1:1 mark-to-space ratio of the resulting pulse waveform and, hence, a mean current value when that function is not selected and the counter is not actually slowly clocked. When that function is selected, then the respective counter will be slowly clocked up or down, hence, slowly changing the mark-to-space ratio of the pulse waveform from the respective bistable circuit up or down for so long as that function is selected until a desired value is reached.

What is claimed is:

1. A remote control system comprising a transmitter having an encoder and a receiver having a decoder, in which each of a plurality of remote control functions is represented by a message sequence comprising a plurality of binary bits of which a binary bit 0 and a binary bit 1 are distinguishable from each other by having, for the whole duration of a bit period, different time ratios of two different parameters, being respectively a high level and a low level portion of a bit period, forming a pulse duration signal comprising an edge each time the said signal is changing from one level to the other, said message sequence being repeated at least twice by said transmitter, wherein in order to be able to use the same encoder at the transmitter side and the same decoder at the receiver side both for ultrasonic and infra-red transmission of said binary bits, the encoder comprises means for converting, in the case of infra-red transmission, said pulse duration signal into a pulse position modulation signal whereby a data pulse is transmitted on each edge of said pulse duration signal, and wherein the decoder comprises means for reconstituting, in case of infra-red transmission, the received pulse position modulation signal into the original pulse duration signal and wherein the encoder further comprises an extra pulse generator for generating an additional pulse (EP) which is transmitted between alternate message sequences whereby each alternate message sequence is inverted when decoded by said decoder to ensure that, in the event of undesirable initial message sequence inversion in the decoder, a correct message sequence is received at least once.

2. A transmitter for a remote control system as claimed in claim 1, wherein said message sequence comprises a flow of binary coded words, the first word being an m-bit start word common to all the remote control functions, the second word being an n-bit message word peculiar to a selected control function, and the third and fourth words being complements of the start and message words.

3. A transmitter for a remote control system as claimed in claim 2, wherein the start word comprises at least one alternating sequence of three binary bits.

4. A transmitter for use in a system as claimed in claim 1, wherein said means for converting the pulse duration signal into a pulse position modulation signal comprises a first AND-Gate to a first input terminal of which the pulse duration signal is applied, a second AND-Gate to a first input terminal of which a switching signal is applied, a transmission mode terminal to which is applied an information signal determining whether infra-red or ultrasonic transmission should occur, said transmission mode terminal being connected to a second input terminal of said second AND-Gate and through an inverter to a second input terminal of said first AND-Gate, and an OR gate having two inputs respectively coupled to the two outputs of the two AND-Gates and an output terminal coupled to a transmitting device.

5. A transmitter as claimed in claim 4, further comprising function selection means, a message encoder which in response to operation of the function selection means provides an n-bit binary coded message word appropriate to the selected function, a parallel-to-serial output shift register, a data selector which enables the output shift register to be loaded with either a message word or a fixed m-bit binary coded start word, a data pulse generator, means for controlling the generator from the output of the output shift register, a true-complement selector and timing control means which, in response to continued operation of the function selection means continously shifts the output shift register and controls the data selector and the true-complement selector so that the generator transmits data pulses corresponding to the modulating waveform of successive binary bits which form a repeated message sequence.

6. A receiver for use in a system as claimed in any of the claims 1 to 3, wherein said means in the decoder for reconstituting the received pulse position modulation signal into the original pulse duration signal are a first AND-Gate (G16) to a first input terminal of which the received signal is applied, a divide-by-two circuit (DR5) to an input terminal of which also said received signal is applied, a second AND-Gate (G17) a first input terminal of which is connected to an output terminal of said divide-by-two circuit (DR5), an input terminal (IR/US'), to which is applied an information signal indicating whether infra-red or ultrasonic transmission takes place, connected to a second input terminal of said second AND-Gate (G17) and through an inverter (IV3) to a second input terminal of said first AND-Gate (G16), and wherein the two output terminals of said two AND-Gates (G16, G17) are connected to two input terminals of an OR-Gate (G18) from the output terminal of which the pulse duration signal is obtained.

7. A receiver as claimed in claim 6, which further comprises a bit detector adapted to detect binary bits corresponding to received data pulses, an interrupt detector responsive to an interruption in the detection of the immediately successive bits by the bit detector, a serial-to-parallel input shift register into which the detected bits are fed, a monitoring unit, said monitoring unit being adapted to recognize either a start word or a complement start word in the input shift register, being settable by an output from the interrupt detector to recognize a start word, being adapted to provide a first output signal in response to the recognition of a start word which has followed an output from the interrupt detector and which is followed by the detection of n-bits, and being adapted to provide a second output signal in response to the recognition of a start word followed by the detection of n-bits followed by the recognition of a complement start word followed by the detection of a further n-bits, an n-bit store into which the contents of the input shift register are transferred in response to said first output signal from the monitoring unit, a comparator adapted to compare the contents of the input shift register and the store, and a bistable circuit, said bistable circuit having an output arranged to enable or disable a remote control function corresponding to the contents of the store, said bistable circuit having a first input arranged to provide a disable output from the bistable circuit in response to an output from the interrupt detector, a second input to which said output signal from the monitoring unit is applied as a clock signal, and a third input connected to an output of the comparator such that the condition of the comparator is transferred by said clock signal to the output of the bistable circuit as a corresponding enable or disable output.

8. A receiver as claimed in claim 7, wherein the bit detector includes means adapted to derive from the received data pulses a waveform of short pulses corresponding to a first type of binary bit and long pulses corresponding to a second type of binary bits, and up/down counter which counts in response to pulses from a clock, said up/down counter being responsive to the beginning of a waveform pulse to commence counting up from a clear condition and being responsive to the end of a waveform pulse to commence counting down, and means responsive to the end of a waveform pulse to enable either a first type or a second type binary bit to be fed into the input shift register at the beginning of the next waveform pulse according to whether or not the counter has counted down to the clear condition before the beginning of the next waveform pulse.

9. A receiver as claimed in claim 8, wherein the monitoring unit includes a start word detector and a complement start word detector connected to the input shift register, a latching circuit, said latching circuit being set in response to an interruption in the detection of immediately successive bits by the bit detector or being set by the complement start word detector, and reset by the start word detector, a counter which divides by at least $2n+m$, said counter being clocked by the input pulse waveform, stopped in response to an interruption in the detection of immediately successive bits by the bit detector, and cleared and enabled to count in response to a set output from the latching circuit and the detection of a start word, and a decoding circuit, which decoding circuit decodes a count of n in the counter to give said first output signal and which is inhibited by an enable output from the bistable circuit, which decoding circuit also decodes a count of $n+m$ in the counter to give an output signal which is arranged to stop the counter unless a complement start word is simultaneously detected, and which decoding circuit also decodes a count of $2n+m$ in the counter to give said second output signal and which is inhibited if the latching circuit is not set.

* * * * *